(12) United States Patent
Lee

(10) Patent No.: US 10,288,691 B2
(45) Date of Patent: May 14, 2019

(54) METHOD AND SYSTEM FOR ESTIMATING BATTERY MODEL PARAMETERS TO UPDATE BATTERY MODELS USED FOR CONTROLS

(71) Applicant: Ford Global Technologies, LLC, Dearborn, MI (US)

(72) Inventor: Tae-Kyung Lee, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 700 days.

(21) Appl. No.: 14/296,630

(22) Filed: Jun. 5, 2014

(65) Prior Publication Data

US 2015/0355283 A1 Dec. 10, 2015

(51) Int. Cl.
| | |
|---|---|
| *G01R 31/36* | (2019.01) |
| *G01R 31/382* | (2019.01) |
| *G01R 31/3842* | (2019.01) |
| *G01R 31/367* | (2019.01) |
| *G01R 31/3835* | (2019.01) |
| *G01R 31/389* | (2019.01) |

(52) U.S. Cl.
CPC ....... *G01R 31/3648* (2013.01); *G01R 31/367* (2019.01); *G01R 31/382* (2019.01); *G01R 31/3835* (2019.01); *G01R 31/3842* (2019.01); *G01R 31/389* (2019.01)

(58) Field of Classification Search
CPC ............ G01R 31/3624; G01R 31/3662; G01R 31/3606; G01R 31/318357; B05B 23/0254
See application file for complete search history.

(56) References Cited

U.S. PATENT DOCUMENTS

| | | | |
|---|---|---|---|
| 8,103,485 B2 | 1/2012 | Plett | |
| 8,108,161 B2 * | 1/2012 | Tomura | G01R 31/3624 320/132 |
| 8,498,766 B2 * | 7/2013 | Takahashi | B60L 1/003 701/22 |
| 2006/0284600 A1 * | 12/2006 | Verbrugge | G01R 31/3651 320/132 |
| 2007/0299620 A1 * | 12/2007 | Yun | B60L 11/1861 702/63 |
| 2009/0048793 A1 * | 2/2009 | Schoch | G01R 31/3651 702/63 |

(Continued)

FOREIGN PATENT DOCUMENTS

| | | |
|---|---|---|
| CN | 102062841 A | 5/2011 |
| CN | 103941195 A | 7/2014 |
| JP | 2008241246 A * | 10/2008 ......... G01R 31/3624 |

OTHER PUBLICATIONS

State Intellectual Property Office of China, First Chinese Office Action for Chinese Patent Application No. 201510303317.7 dated Sep. 28, 2018.

*Primary Examiner* — Ricky Ngon
(74) *Attorney, Agent, or Firm* — David B. Kelley; Brooks Kushman P.C.

(57) ABSTRACT

A powertrain having a traction battery is operated according to performance variables of the battery based on state variables of a reduced-order electrochemical model of the battery. The state variables are estimated by an estimator based on the battery model. A parameter of the battery model characterizing dynamics of the state variables with respect to battery operating conditions is updated by the estimator based on the battery model.

2 Claims, 4 Drawing Sheets

(56) References Cited

U.S. PATENT DOCUMENTS

| | | | |
|---|---|---|---|
| 2009/0276172 A1* | 11/2009 | Nishi | G01R 31/3651 702/63 |
| 2010/0153038 A1* | 6/2010 | Tomura | G01R 31/3624 702/63 |
| 2011/0031938 A1* | 2/2011 | Ishikawa | G01R 31/3624 320/162 |
| 2011/0060565 A1* | 3/2011 | Sciarretta | G01R 31/3651 703/2 |
| 2011/0161025 A1* | 6/2011 | Tomura | G01R 31/3651 702/63 |
| 2011/0288797 A1* | 11/2011 | Schmidt | H01M 10/0525 702/63 |
| 2012/0130692 A1 | 5/2012 | Li et al. | |
| 2013/0030739 A1* | 1/2013 | Takahashi | G01R 31/3658 702/63 |
| 2013/0057291 A1* | 3/2013 | Takahashi | G01R 31/3662 324/427 |
| 2013/0119921 A1 | 5/2013 | Choe et al. | |
| 2013/0317697 A1* | 11/2013 | Hotta | G01R 31/3651 701/34.4 |
| 2014/0210418 A1* | 7/2014 | Wang | G01R 31/3651 320/134 |
| 2014/0333317 A1* | 11/2014 | Frost | G01R 31/3606 324/430 |
| 2014/0340045 A1* | 11/2014 | Itabashi | G01R 31/3624 320/134 |
| 2015/0106044 A1 | 4/2015 | Driemeyer-Franco et al. | |
| 2015/0355615 A1 | 12/2015 | Lee | |
| 2016/0252585 A1* | 9/2016 | Baba | H01M 10/48 702/63 |

\* cited by examiner

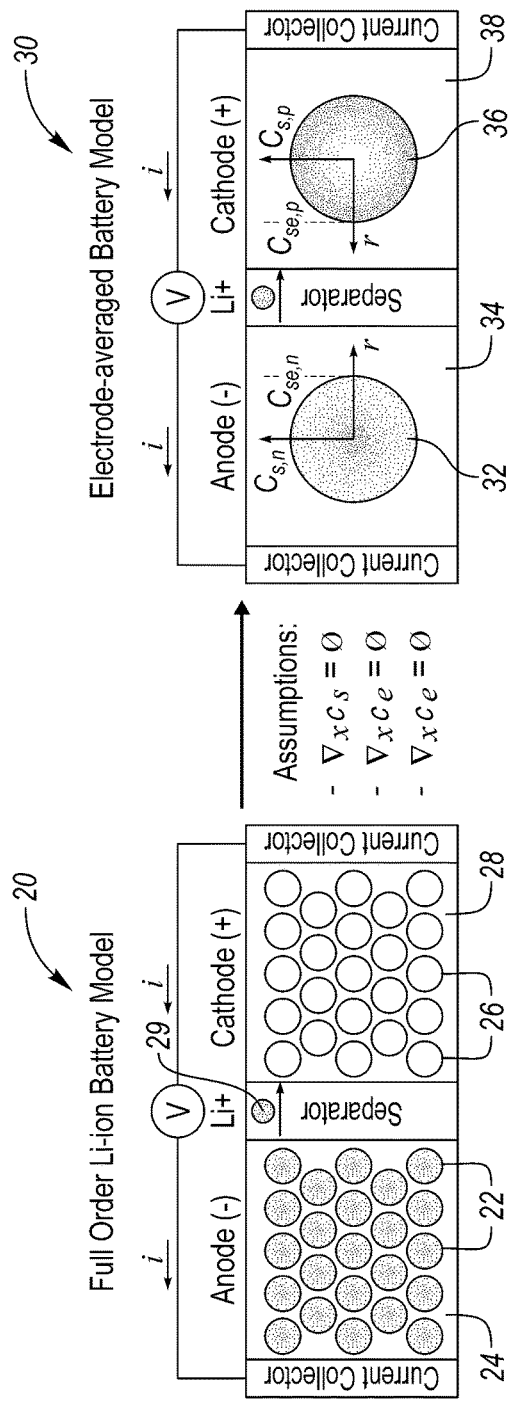
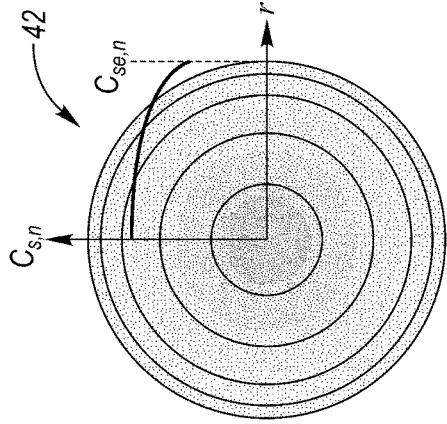
FIG. 2
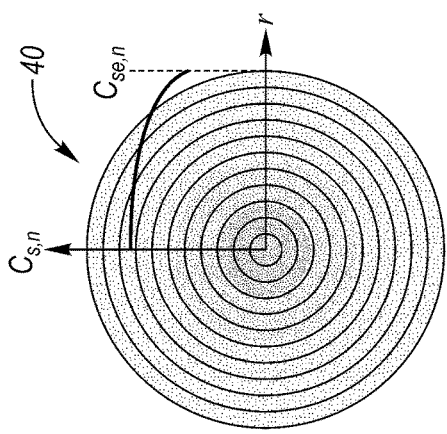
FIG. 3A
FIG. 3B

METHOD AND SYSTEM FOR ESTIMATING BATTERY MODEL PARAMETERS TO UPDATE BATTERY MODELS USED FOR CONTROLS

TECHNICAL FIELD

The present invention relates to battery models used to: estimate battery model parameters characterizing dynamic responses of a battery; estimate state variables from the estimated parameter values using battery input current and measured battery voltage; estimate performance variables including battery available power limits and state of charge (SOC) of a battery; and control a battery system using the performance variables.

BACKGROUND

Control oriented models are prerequisites for battery model based control design. As system complexity increases, output feedback approaches are not sufficient to obtain desired system performance. Fast and accurate control oriented models should be developed to utilize the model based control approach. Existing battery management algorithms rely on map-based control calibrated with experimental data or model-based control using equivalent circuit model. Map-based control requires higher degree-of-freedom calibration maps when system complexity is high. Furthermore, the number of maps should be large to cover the wide range of battery SOC and temperature variations. In general, battery response is dependent on time history of battery operations. Hence, the map based control has limitations in representing all possible battery operations. Equivalent circuit model based control approaches are computationally efficient, but electrochemical phenomena are not directly represented. Furthermore, when prediction accuracy of the model should be improved, model complexity should be increased as well. In this case, the computational benefit decreases significantly.

SUMMARY

In embodiments, a battery model parameter estimation method for a reduced-order electrochemical battery model is provided. The reduced-order battery model is derived from a full electrochemical battery model. The reduced-order model includes a single ordinary differential equation to emulate slow and medium electrochemical dynamics and an instantaneous voltage drops by current inputs. Two model parameters, the effective diffusion coefficient and the effective internal resistance, are introduced to model the corresponding dynamics. The battery model parameters are updated over the battery life or depending on operating conditions by processing the input current profiles and the measured output voltage profiles. A system having the battery such as a powertrain is operated based on performance variables of the battery. The performance variables include the battery state of charge and the allowable battery power limits. The battery may be a Lithium-Ion (Li-ion) battery. The performance variables are estimated from the estimated state variables expressed by Li-ion concentration representing the electrochemical dynamics of the positive electrode and the negative electrode.

In embodiments, a method for a powertrain having a Lithium-ion (Li-ion) traction battery pack includes estimating model parameters of a reduced-order electrochemical battery model represented by an ordinary differential equation to capture the electrochemical dynamics of the positive electrode and the negative electrode of the battery pack. The method is based on the reduced-order battery model adopting and modifying the structure of an electrode-averaged model. The method may include estimating the effective Li-ion concentration of a battery cell to estimate battery state variables, terminal voltage responses, available power, and a state of charge of the battery pack. The method includes updating values of parameters of the battery model to capture the battery dynamics change and capacity fade over the battery life.

In an embodiment, a method for a powertrain having a traction battery includes operating the powertrain according to performance variables of the battery based on state variables of a reduced-order electrochemical model of the battery estimated by an estimator based on the battery model. A parameter of the battery model characterizing dynamics of the state variables with respect to battery operating conditions is updated by the estimator based on the battery model.

BRIEF DESCRIPTION OF THE DRAWINGS

FIG. 2 illustrates a representation of a full-order electrochemical battery model and a reduced-order electrochemical battery model (i.e., an electrode-averaged battery model) derived from the full-order battery model pursuant to a battery state of charge (SOC) estimation process in accordance with embodiments of the present invention;

FIG. 3A illustrates a representation of an even discretization of the Li-ion concentration profile along the electrode solid particle radius for the reduced-order battery model;

FIG. 3B illustrates a representation of an uneven discretization of the Li-ion concentration profile along the electrode solid particle radius for the reduced-order battery model;

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
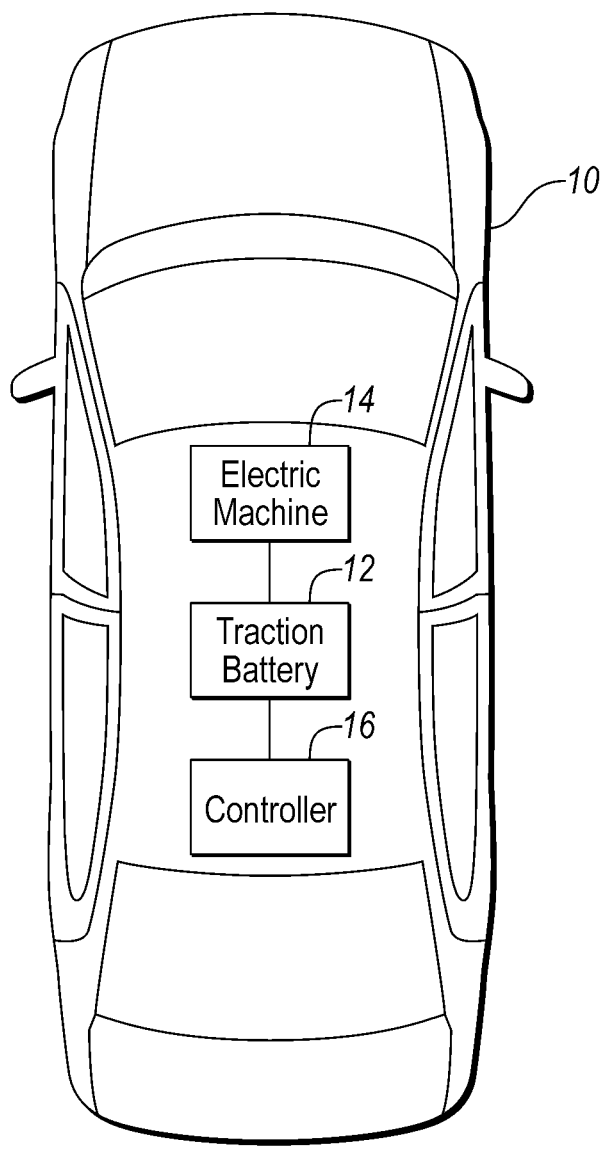
FIG. 1 illustrates a block diagram of a power storage system of an electric vehicle in accordance with embodiments of the present invention.

Referring now to FIG. 1, a block diagram of a power storage system of an electric vehicle 10 such as a hybrid electric vehicle in accordance with embodiments of the present invention is shown. The power storage system includes a traction battery 12. Battery 12 is configured to provide electrical power to an electric machine 14 such as a motor/generator that converts the electrical power to motive power for propelling vehicle 10. Battery 12 includes any number and/or type of energy storage cells. For instance, battery 12 is a Lithium-Ion (Li-ion) battery having a plurality of Li-ion power storage cells.

A controller 16 is configured to estimate battery model parameters associated with battery 12 and control the operation of the battery based on these estimated parameters and other factors. Controller 16 is further configured to estimate the state of charge (SOC) of battery 12 pursuant to a battery SOC estimation process in accordance with embodiments of the present invention. The SOC estimation process includes estimating the SOC of battery 12 from the (measured) battery voltage in real time using a reduced-order electrochemistry model of the battery.

The SOC estimation process further includes a process for estimating parameters of the reduced-order battery model whereby the battery model more accurately reflects the battery at any given point over the lifetime of the battery. The battery model parameters characterize the response or dynamics of battery 12. Such battery model parameters include the effective diffusion coefficient and the effective internal resistance. The values of such battery model parameters may change when the driving modes are significantly different or when battery characteristics change over the battery life. This is caused by the different dominant battery dynamics at each driving mode or battery life. As a result of the parameter adaption, the estimated battery state variables and the associated performance variables from using the battery model will generally be more accurate.

Objectives of the development of a reduced-order electrochemical battery model and state estimators include: 1) generating a reduced-order electrochemical battery model (i.e., an electrode-averaged battery model) which can capture the dynamics of battery 12 with sufficient accuracy; 2) estimating model parameters of the battery model in order to update the model parameter changes depending on operating conditions or the battery life—the battery model parameters including the diffusion coefficient and the internal resistance; 3) designing an Extended Kalman filter framework to estimate state variables and model parameters concurrently; and 4) estimating battery states variables and the associated performance variables from the measured battery voltage in real-time using the (updated) battery model.

The derivation of the reduced-order or electrode-averaged model of battery 12 ("reduced-order battery model") is based on the understanding of the full-order electrochemical model of battery 12. This full-order battery model is manipulated to the reduced-order model with the assumption that each electrode (i.e., cathode and anode) can be represented by the averaged electrode particle. The reduced model is then further reduced with the assumption that the diffusion dynamics can be represented by a representative diffusion dynamics accounting for the combined dynamics of the cathode and anode. This makes the resulting model size employing a single particle approach to be one-half of a model with two single particles. The resulting diffusion dynamics are the averaged diffusion dynamics of the cathode and the anode.

Separately, instantaneous voltage drops by the electrolyte and the over-potential, which is computed from the Butler-Volmer current density equation, are combined in a single internal resistance term. These assumptions make the reduced-order or electrode-averaged battery model even simpler as open potential and electrolyte potential terms do not need to be computed separately.

In turn, effective Li-ion concentration profiles, which represent the dynamic responses of a battery cell (or pack), are estimated from input current profiles of output voltage measurement profiles using Extended Kalman Filter (EKF) based on the reduced-order battery model. The battery performance variables, including battery state of charge and available power limits, are then computed from the estimated Li-ion concentration profiles.

Referring now to FIG. 2, an illustration of the full-order electrochemical battery model 20 and an illustration of the reduced-order electrochemical battery model 30 derived from full-order battery model 20 are shown. The reduced-order model is further simplified to estimate battery electrochemical states represented by Li-ion concentration profiles and to estimate the battery SOC.

Again, with reference to FIG. 2, dynamics of the positive and negative electrodes may be represented by the combined dynamics of each electrode. As shown in FIG. 2, full-order battery model 20 includes a plurality of active material, solid particles 22 immersed within an electrolyte solution 24 in the anode and a plurality of active material, solid particles 26 immersed within an electrolyte solution 28 in the cathode. As known to one of ordinary skill, a Li-ion 29 (only one shown for simplicity) moves along a path from solid particles 22 of the anode to a path of solid particles 26 of the cathode to thereby generate electric current I upon an application of a voltage V across the battery.

As further shown in FIG. 2, reduced-order battery model 30 is simplified relative to full-order battery model 20 by including an averaged solid particle 32 immersed in an electrolyte solution 34 in the anode and an averaged solid particle 36 immersed in an electrolyte solution 38 in the cathode. Averaged solid particle 32 is representative of the plurality of solid particles 22 in the anode of full-order battery model 20 and averaged solid particle 36 is representative of the plurality of solid particles 26 in the cathode of full-order battery model 20.

The derivation of reduced-order battery model 30 from full-order battery model 20 will now be described in detail. As known to one of ordinary skill, full-order battery model 20 is represented by the following equations:

$$\vec{\nabla}_x K^{eff} \vec{\nabla}_x \phi_e + \vec{\nabla}_x K_D^{eff} \vec{\nabla}_x \ln c_e = -j^{Li}$$

$$\vec{\nabla}_x \sigma^{eff} \vec{\nabla}_x \phi_s = j^{Li}$$

$$\frac{\partial \varepsilon_e c_e}{\partial t} = \vec{\nabla}_x \left( D_e^{eff} \vec{\nabla}_x c_e \right) + \frac{1-t^0}{F} j^{Li}$$

$$\frac{\partial c_s}{\partial t} = \vec{\nabla}_r (D_s \vec{\nabla}_r c_s)$$

where $\phi$ is the electric potential, c is the Li-ion concentration, subscript s and e represent the active electrode solid particle and the electrolyte respectively, $\sigma^{eff}$ is the effective electrical conductivity of the electrode, $\kappa^{eff}$ is the effective electrical conductivity of the electrolyte, $\kappa_D^{eff}$ is the liquid junction potential term, $D_s$ is the diffusion coefficient of Li-ion in the electrode, $D_e^{eff}$ is the effective diffusion coefficient of Li-ion in the electrolyte, $t^0$ is the transference number, and F is the Faraday constant.

The Butler-Volmer current density equation is as follows:

$$j^{Li} = a_s j_0 \left[ \exp\left(\frac{\alpha_a F}{RT}\eta\right) - \exp\left(-\frac{\alpha_c F}{RT}\eta\right) \right] \quad (5)$$

where, $\alpha_a$ is the transfer coefficient for anodic reaction, $\alpha_c$ is the transfer coefficient for cathodic reaction, R is the gas constant, T is the temperature, $\eta = \phi_s - \phi_e - U(c_{se})$ is the over potential at the solid-electrolyte interface at an active solid particle, and $j_0 = k(c_e)^{\alpha_a}(c_{s,max} - c_{se})^{\alpha_a}(c_{se})^{\alpha_c}$.

The battery terminal voltage V is according to the following equation:

$$V = \phi_s(x=L) - \phi_s(x=0) - \frac{R_f}{A} I$$

Reduced-order battery model 30 is derived from full-order battery model 20 by making the following assumptions as shown in FIG. 2:

$\nabla_x \emptyset_s$ is 0 (the gradient of the electric potential in the solid with respect to the direction from the anode to the cathode (i.e., the x-direction) is zero);

$\nabla_x \emptyset_e$ is 0 (the gradient of the electric potential in the electrolyte with respect to the x-direction is zero); and $\nabla_x c_e$ is 0 (the gradient of the Li-ion concentration in the electrolyte ($c_e$) with respect to the x-direction is zero).

As a result of these assumptions, reduced-order battery model 30 is represented by the following ordinary differential equation (ODE) of each electrode (1):

$$\frac{\partial c_s}{\partial t} = \vec{\nabla}_r (D_s \vec{\nabla}_r c_s) \quad (1)$$

The derived ODE represents the electrochemical dynamics of each electrode.

With the assumption that the electrochemical dynamics of the positive and negative electrodes can be combined and then represented by one ODE, an effective Li-ion concentration profile representing electrochemical dynamics combining both electrodes is estimated by the ODE.

The battery terminal voltage is according to the following equation (2):

$$V = U(\Theta_{se}) - R_0 i \quad (2)$$

where $\theta_{se}$ represents the value of the normalized effective Li-ion concentration at the solid-electrolyte interface.

$R_0$ is the effective internal resistance. $R_0$ depends on the open circuit voltage and changes over time during the lifetime of battery 12.

The ODE (1) describes the Li-ion diffusion dynamics and other medium-to-slow electrochemical dynamics of battery 12. The states of the equation (1) are Li-ion concentrations along the discretized particle radius and are given by the following matrix equation (3):

$$c_s = [c_{s,1} \ldots c_{s,Mr-1}]^T \quad (3)$$

The control input is battery input current represented by the following equation (4):

$$u_k = i_k \quad (4)$$

The (measured) system output is the battery terminal voltage and the battery terminal voltage expression is represented by the following equation (5):

$$y_k = U(\Theta_{se,k}) - R_{0,k} i_k \quad (5)$$

Equation (5) for the measured battery terminal voltage corresponds to the proposed terminal voltage equation (2) ($V = U(\Theta_{se}) - R_0 i$).

As described herein, only one ordinary differential equation (i.e., the state-space equation (1)) is solved for both of the anode and the cathode. Thus, the diffusion dynamics from equation (1) represent the averaged sense of the diffusion dynamics of both the anode and the cathode. The battery terminal voltage is reduced to the terminal voltage equation (2) with the assumption that the over-potential and voltage drops by electrolyte can be represented by the effective internal resistance $R_0$. This assumption enables to exclude over-potential calculations associated with full-order battery model 20 and thus the resulting reduced-order battery model 30 is even simpler.

The battery model parameters to be estimated for updating reduced-order battery model 30 include the effective diffusion coefficient $D_s$ and the effective internal resistance $R_0$. The model parameters characterize the battery electrochemical dynamics. These battery model parameters are set forth according to the following matrix equation (6):

$$\theta = [D_s R_0]^T \quad (6)$$

The Li-ion concentrations along the discretized particle radius given by the matrix equation (3) ($c_s = [c_{s,1} \ldots c_{s,Mr-1}]^T$) and the model parameters given by the matrix equation (6) ($\theta = [D_s R_0]^T$), which are all to be estimated, form an augmented state vector X according to the following matrix equation (7):

$$X = [C_s; \theta] \quad (7)$$

As indicated, the augmented state vector X includes the Li-ion concentration vector in the electrode solid particle $c_s$, the effective diffusion coefficient $D_s$, and the battery internal resistance $R_0$.

Referring now to FIGS. 3A and 3B, with continual reference to FIG. 2, representations of an even discretization 40 and an uneven discretization 42 of the Li-ion concentration profile along the electrode solid particle radius for reduced-order battery model 30 are shown, respectively. Objectives of uneven discretization 42 include obtaining the same level of prediction accuracy with a reduced order model while maintaining Li-ion concentration profile observability.

For uneven discretization 42, the state-space, ordinary differential equation (1), which describes the Li-ion concentration diffusion dynamics in the averaged solid particle, converts to the following matrix equation (8):

$$\dot{c}_s = A c_s + B u \quad (8)$$

where $$A = \begin{bmatrix} -\frac{2D_{s,k}}{r_1^2} & \frac{2D_s}{r_1^2} & \cdots & 0 & 0 \\ 0 & \ddots & & & 0 \\ \vdots & \alpha_j\left(\frac{1}{\Delta r_{j-1}} - \frac{1}{r_j}\right) & -\alpha_j\left(\frac{1}{\Delta r_j} + \frac{1}{\Delta r_{j-1}}\right) & \alpha_j\left(\frac{1}{\Delta r_j} + \frac{1}{r_j}\right) & \vdots \\ 0 & & \ddots & & 0 \\ 0 & 0 & \cdots & \alpha_{Mr-1}\left(\frac{1}{\Delta r_{Mr-2}} - \frac{1}{r_{Mr-1}}\right) & -\alpha_{Mr-1}\left(\frac{1}{\Delta r_{Mr-2}} - \frac{1}{r_{Mr-1}}\right) \end{bmatrix}$$

$$B = \begin{bmatrix} 0 & \cdots & 0 & -\alpha_{Mr-1}\left(1 + \frac{\Delta r_{Mr-1}}{r_{Mr-1}}\right)\frac{1}{Fa_sD_s} \end{bmatrix}^T$$

Again, the state vector of the state space equation derived from equation (1) ($c_s = [c_{s,1} \ldots c_{s,Mr-1}]^T$) represents the Li-ion concentration profiles along the electrode solid particle radius. The state space equation is expressed in equation (8).

The continuous expression of the augmented state-space equation of state-space matrix equation (8) ($\dot{c}_s = Ac_s + Bu$) is represented by the following matrix equation (9):

$$\begin{bmatrix} \dot{c}_s \\ \dot{D}_s \\ \dot{R}_0 \end{bmatrix} = F \begin{bmatrix} c_s \\ D_s \\ R_0 \end{bmatrix} + \begin{bmatrix} B \\ 0 \\ 0 \end{bmatrix} i \quad (9)$$

where $$F = \begin{bmatrix} -\frac{2D_{s,k}}{r_1^2} & \frac{2D_s}{r_1^2} & \cdots & 0 & 0 & \frac{A(1,:)}{D_s}c_s & 0 \\ 0 & \ddots & & & 0 & & \\ \vdots & \alpha_j\left(\frac{1}{\Delta r_{j-1}} - \frac{1}{r_j}\right) & -\alpha_j\left(\frac{1}{\Delta r_j} + \frac{1}{\Delta r_{j-1}}\right) & \alpha_j\left(\frac{1}{\Delta r_j} + \frac{1}{r_j}\right) & \vdots & \vdots & \vdots \\ 0 & & & & 0 & & \\ 0 & 0 & \cdots & \alpha_{Mr-1}\left(\frac{1}{\Delta r_{Mr-2}} - \frac{1}{r_{Mr-1}}\right) & -\alpha_{Mr-1}\left(\frac{1}{\Delta r_{Mr-2}} - \frac{1}{r_{Mr-1}}\right) & \frac{A(Mr-1,:)}{D_s}c_s & 0 \\ 0 & & \cdots & & 0 & 0 & 0 \\ 0 & & \cdots & & 0 & 0 & 0 \end{bmatrix}$$

$$B = \begin{bmatrix} 0 \\ \vdots \\ 0 \\ -\frac{2}{\Delta r_{Mr-2} + \Delta r_{Mr-1}}\left(1 + \frac{\Delta r_{Mr-1}}{r_{Mr-1}}\right)\frac{1}{Fa_sA\delta_p} \end{bmatrix}$$

The discretized expression of the augmented state-space equation of state-space matrix equation (8) ($\dot{c}_s = Ac_s + Bu$) is represented by the following matrix equation (10):

$$\begin{bmatrix} c_{s,k+1} \\ D_{s,k+1} \\ R_{0,k+1} \end{bmatrix} = F_k \begin{bmatrix} c_{s,k} \\ D_{s,k} \\ R_{0,k} \end{bmatrix} + \begin{bmatrix} B_k \\ 0 \\ 0 \end{bmatrix} i_k \quad (10)$$

where $F_k = (I + F\Delta t)$ $B_k = B\Delta t$

The battery terminal voltage equation is then given by the following matrix equation (11):

$$y_k = H_k \begin{bmatrix} x_k \\ D_{s,k} \\ R_{0,k} \end{bmatrix} + [-R_{0,k}]i_k \quad (11)$$

where $$H_k = \frac{\partial V}{\partial X} = \begin{bmatrix} 0 & \cdots & 0 & \left.\frac{\partial U(\theta_{se})}{\partial c_{s,se}}\right|_k & |0 & -i_k \end{bmatrix}$$

From $F_k$ and $H_k$ (or from F and H) battery 12 is fully observable. (Note that the symbol F or $F_k$ may be replaced herein with the symbol A or $A_k$.)

The matrix equation (10) representing the discretized expression of the augmented state-space equation of state-space matrix equation (8) is directly used in the Extended Kalman filter (EKF) framework described in detail below. The model based observer using EKF follows the following series of equations.

Predict:

$\hat{x}_{k|k-1} = f(\hat{x}_{k-1|k-1}, u_{k-1})$ $P_{k|k-1} = F_{k-1}P_{k-1|k-1}F_{k-1}^T + Q_k$ Update:

$$\tilde{y}_k = y_k - h(\hat{x}_{k|k-1})$$

$$S_k = H_k P_{k|k-1} H_k^T + R_k$$

$$K_k = P_{k|k-1} H_k^T S_k^{-1}$$

$$\hat{x}_{k|k} = \hat{x}_{k|k-1} + K_k \tilde{y}_k$$

$$P_{k|k} = (I - K_k H_k) P_{k|k-1}$$

where, $$F_{k-1} = \frac{\partial f}{\partial x}\bigg|_{\hat{x}_{k-1|k-1}, u_{k-1}}$$

$$H_k = \frac{\partial h}{\partial x}\bigg|_{\hat{x}_{k|k-1}}$$

$$P_{k|k} = \text{cov}(x_k - \hat{x}_{k|k}) = E\big((x_k - \hat{x}_{k|k})(x_k - \hat{x}_{k|k})^T\big)$$

$$P_{k|k-1} = \text{cov}(x_k - \hat{x}_{k|k-1}) = E\big((x_k - \hat{x}_{k|k-1})(x_k - \hat{x}_{k|k-1})^T\big)$$

$$S_k = \text{cov}(y_k - \hat{y}_k) = E\big((y_k - \hat{y}_k)(y_k - \hat{y}_k)^T\big)$$

$$Q_k = \text{cov}(\omega_k) = E(\omega_k \omega_k^T)$$

$$R_k = \text{cov}(v_k) = E(v_k v_k^T)$$

Figure 4:
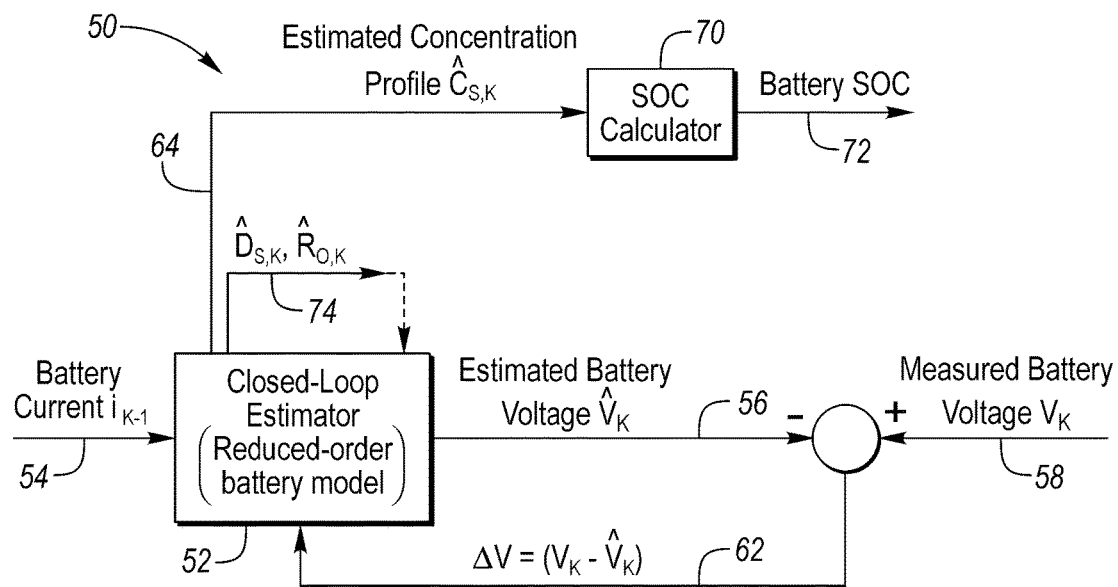
FIG. 4 illustrates a block diagram describing operation of a method and system for estimating the diffusion coefficient parameter and the internal resistance parameter of the reduced-order battery model, used for estimating the SOC of a battery, in order to update the battery model in accordance with embodiments of the present invention.

Referring now to FIG. 4, a block diagram 50 illustrating operation of estimating the diffusion coefficient parameter and the internal resistance parameter of reduced-order battery model, used for estimating battery state variables and the associated performance variables, in order to update the battery model in accordance with embodiments of the present invention is shown. Again, controller 16 is configured to estimate the battery model parameters (i.e., the diffusion coefficient parameter and the internal resistance parameter of the battery model) in order to accurately reflect the battery dynamic characteristics at any given point over the lifetime of battery 12. Controller 16 is further configured to in turn estimate the battery SOC using the reduced-order battery model.

The operation employs a closed-loop estimator 52 according to reduced-order battery model. The design of estimator 52 pursuant to the EKF techniques described herein is characterized by the discretized augmented state-space equation (12)

$$\begin{bmatrix} c_{s,k+1} \\ D_{s,k+1} \\ R_{0,k+1} \end{bmatrix} = F_k \begin{bmatrix} c_{s,k} \\ D_{s,k} \\ R_{0,k} \end{bmatrix} + \begin{bmatrix} B_k \\ 0 \\ 0 \end{bmatrix} i_k \tag{12}$$

and the measured battery voltage matrix equation (13)

$$y_k = H_k \begin{bmatrix} x_k \\ D_{s,k} \\ R_{0,k} \end{bmatrix} + [-R_{0,k}] i_k. \tag{13}$$

As indicated above, the control input to estimator 52 is the current $i_{k-1}$ 54 of battery 12. Estimator 52 generates an estimated battery voltage $v_k$ 56 based on the battery current $i_{k-1}$ 54. The actual battery voltage $v_k$ 58 is measured. The estimated and measured battery voltages 56 and 58 are input to a comparator 60. Comparator 60 generates a difference $\Delta v$ 62 indicative of the voltage difference between the estimated and measured battery voltages 56 and 58. The voltage difference $\Delta v$ 62 is input back to estimator 52, which in turn generates another battery voltage estimate 56. This process repeats to cause the voltage difference $\Delta v$ 62 to converge to zero. As a result of the voltage difference $\Delta v$ 62 being close to zero, estimator 52 is able to estimate (Li-ion) concentration profiles $c_{s,k}$ 64 and battery model parameters, $D_s$ and $R_0$, 64 from equations (12) and (13).

The estimated model parameters, $D_s$ and $R_0$, are updated to the battery model, and Li-ion concentration profiles are estimated based on the updated battery model parameters. Then, a battery SOC calculator 70 estimates the battery SOC 72 based on the estimated concentration profile 64 as described herein.

From the equations (12) and (13), estimator 52 also generates relatively accurate estimates of the diffusion coefficient $D_{s,k}$ and internal resistance $R_{0,k}$ parameters 74 of the battery model. Such estimated battery model parameters are used to update the battery model, which is used by estimator 52 in estimating the battery SOC, as described herein.

Figure 5A:
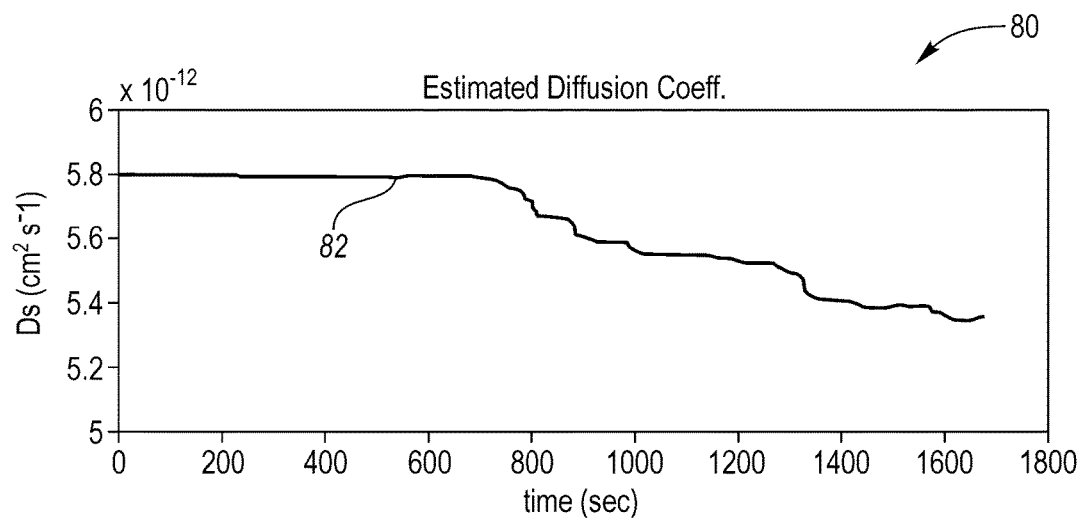
FIG. 5A illustrates a graph depicting the effective diffusion coefficient $D_s$ as updated over time in accordance with embodiments of the present invention.
Figure 5B:
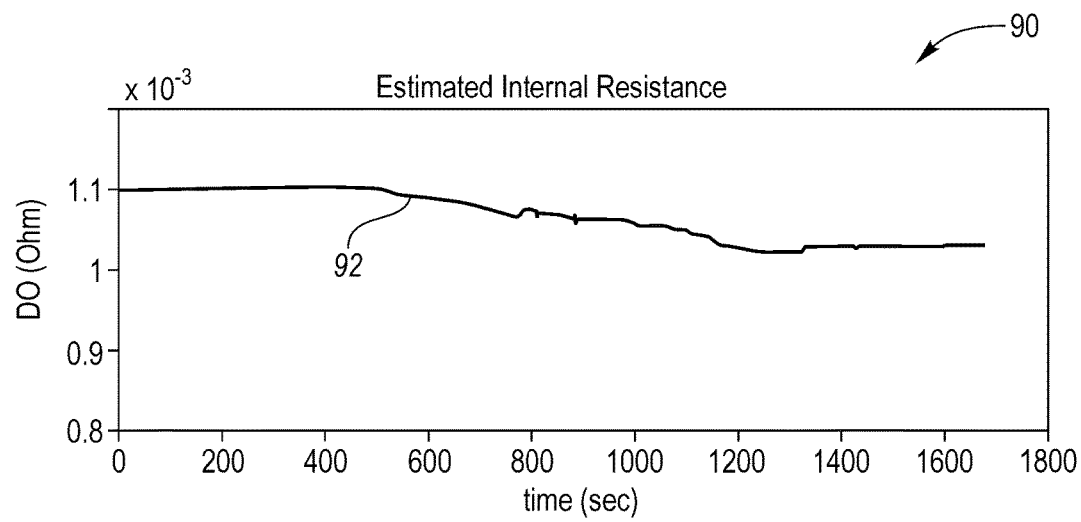
FIG. 5B illustrates a graph depicting the effective internal resistance $R_0$ as updated over time in accordance with embodiments of the present invention.

Referring now to FIGS. 5A and 5B, a graph 80 depicting the effective diffusion coefficient $D_s$ as updated over time in accordance with embodiments of the present invention and a graph 90 depicting the effective internal resistance $R_0$ as updated over time in accordance with embodiments of the present invention are shown. Graph 80 includes a plot line 82 of the effective diffusion coefficient $D_s$ as updated over time. Graph 90 includes a plot line 92 of the effective internal resistance $R_0$ as updated over time.

A method and system for estimating battery model parameters of a reduced-order battery model, used for estimating the state variables of battery 12, includes the following features in accordance with embodiments of the present invention. The electrochemical process of the battery is emulated by the reduced-order battery model. This means that once the model is calibrated, it can be used over a wide range of operating points, SOC, and temperature. The proposed reduced-order battery model is much simpler than full order electrochemical battery models comprising multiple partial differential equations 20. The reduced-order battery model has two model parameters characterizing battery dynamic responses. The model parameters may be updated from current input profiles and measured voltage profiles using the EKF. The EKF is used to estimate the battery model parameters and the state variables. Performance variables including the SOC and the available e power limits are estimated from the estimated state variables. The proposed reduced-order battery model structure is compact enough to implement in the battery management system (BMS) of controller 16.

The method and system for estimating parameters of a reduced-order battery model include other features. The method and system provide a way to estimate battery model parameters from the input current profiles and the measured voltage profiles over the battery lifetime. The number of battery model parameters in the reduced-order model is two. Hence, a model calibration procedure is much simpler than the case of equivalent circuit battery models having the same level of prediction accuracy. The derived battery model structure is compact enough to be used for control design.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method comprising:
   estimating Li-ion concentrations of a battery from measured voltage of the battery using an extended Kalman filter (EKF) based on a battery model having only two parameters of a Li-ion diffusion coefficient and an internal resistance;
   operating the battery and updating the parameters from measured current of the battery and the measured voltage using the EKF;
   causing vehicle propulsion by operating a powertrain per a battery state-of-charge based on the Li-ion concentrations.

2. A method for a vehicle having a powertrain including a controller, a traction battery, and a traction motor, the method comprising:
   estimating, by the controller, Li-ion concentrations of the traction battery from measured voltage of the traction battery using an extended Kalman filter (EKF) based on a model of the traction battery having only two parameters, the two parameters being a Li-ion diffusion coefficient and an internal resistance;
   operating the traction battery, by the controller, per a state-of-charge of the traction battery based on the Li-ion concentrations to have the traction battery provide electrical power to the traction motor to propel the vehicle; and
   updating, by the controller, while the traction battery is operating in providing electrical power to the traction motor to propel the vehicle, the parameters from measured current of the traction battery and the measured voltage of the traction battery using the EKF.

* * * * *